(12) United States Patent
Izumida et al.

(10) Patent No.: US 7,210,222 B2
(45) Date of Patent: May 1, 2007

(54) POWER SUPPLY CONTROL METHOD

(75) Inventors: Keizo Izumida, Yamanashi (JP);
Takeshi Takeda, Yamanashi (JP);
Kazuyuki Nakano, Yamanashi (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 405 days.

(21) Appl. No.: 10/758,094

(22) Filed: Jan. 16, 2004

(65) Prior Publication Data

US 2004/0143964 A1 Jul. 29, 2004

Related U.S. Application Data

(62) Division of application No. 09/959,146, filed as application No. PCT/JP00/02617 on Apr. 21, 2000, now Pat. No. 6,701,611.

(30) Foreign Application Priority Data

Apr. 21, 1999 (JP) ................. 11-113560

(51) Int. Cl.
*H05K 3/30* (2006.01)
(52) U.S. Cl. .................. 29/832; 29/740; 29/743; 29/759; 29/829; 29/834; 29/836; 29/837; 700/160
(58) Field of Classification Search .................. 29/832, 29/740, 743, 759, 829, 834, 836, 837; 700/160
See application file for complete search history.

(56) References Cited

U.S. PATENT DOCUMENTS 4,468,601 A 8/1984 Chamran et al.
5,300,819 A * 4/1994 Lee .............................. 307/47
5,305,524 A 4/1994 Byeon
5,313,401 A 5/1994 Kasai et al.
5,727,311 A 3/1998 Ida et al.
5,911,456 A 6/1999 Tsubouchi et al.
5,982,652 A * 11/1999 Simonelli et al. ........... 363/142

FOREIGN PATENT DOCUMENTS

| JP | 64-78302 | 3/1989 |
|---|---|---|
| JP | 6-161535 | 6/1994 |
| JP | 10-63816 | 3/1998 |
| JP | 10-97653 | 4/1998 |

* cited by examiner

*Primary Examiner*—A. Dexter Tugbang
*Assistant Examiner*—Tim Phan
(74) *Attorney, Agent, or Firm*—Wenderoth, Lind & Ponack, L.L.P.

(57) ABSTRACT

The present invention provides a power supply control method which is executed by the electronic component mounting apparatus. A drive power source and a control power source are separately connected and shut-off in accordance with a command from a control device to each of component feed drive parts for driving component feed devices, a component transfer drive device for driving a component transfer device, and a circuit board positioning drive device for driving a circuit board positioning device. The control device detects an individual occurrence of a halt condition of each of constituent parts of an electronic component mounting apparatus and shuts off a drive power source to the drive device in the halt condition. Thus, wasteful power consumption is eliminated and production is continued with a necessary minimum power.

12 Claims, 7 Drawing Sheets

POWER SUPPLY CONTROL METHOD

This is a Divisional Application of U.S. application Ser. No. 09/959,146, filed Oct. 18, 2001 now U.S. Pat. No. 6,701,611, which is the National Stage of International Application No. PCT/JP00/02617, filed Apr. 21, 2000.

TECHNICAL FIELD

The present invention relates to an electronic component mounting apparatus for mounting electronic components to mount positions on objects such as circuit boards or the like, and a power supply control method executed by the electronic component mounting apparatus.

BACKGROUND ART

FIG. 7 illustrates a conventional electronic component mounting apparatus 50. The electronic component mounting apparatus 50 roughly comprises: component feed devices 1A, 1B for supplying electronic components to be mounted to a circuit board 5; a component transfer device 2 of a rotary type for holding electronic components received from the component feed device 1A or component feed device 1B and mounting these components onto the circuit board 5; a circuit board positioning device 3 for moving the circuit board 5 so that a mount position on the circuit board 5 is positioned at a component hold release position of the component transfer device 2; and a control device 4 for controlling these component feed devices 1A, 1B, the component transfer device 2, and the circuit board positioning device 3 in association with each other. The component feed devices 1A, 1B are driven by component feed drive devices 7A, 7B respectively, the component transfer device 2 is driven by a component transfer drive device 8, and the circuit board positioning device 3 is driven by a circuit board positioning drive device 9. In the electronic component mounting apparatus 50 of this constitution, as indicated in FIG. 8, a power source connected to the component feed devices 1A, 1B, the component transfer device 2, the circuit board positioning device 3, and the control device 4, is shut off by a power source panel 6 and a source connection circuit incorporated in the panel via the component feed drive devices 7A, 7B, the component transfer drive device 8, and the circuit board positioning drive device 9, respectively.

These connections and shut-offs of the power source are generally performed in an order shown in flow charts of FIG. 9. The power source is connected when the electronic component mounting apparatus 50 is in use, and disconnected when the electronic component mounting apparatus 50 is no longer in use at termination of a sequence of production operations or on an occasion of maintenance. In some of electronic component mounting apparatuses, all or part of component feed devices are adapted to supplement components during production with an aim for long-time production, and in this case the power source is disconnected from the drive device for the component feed device to which the components are supplemented. This is generally intended to secure safety of workers handling the electronic component mounting apparatus.

Meanwhile, saving resources and energy has become an issue to be tackled in each of industrial fields from a viewpoint of protecting the earth's environment. Thus, in the electronic component mounting apparatus, cut back of power consumption of entire facilities or per unit production amount is grappled with. On the other hand, an improvement in production capacity per unit time is demanded of the electronic component mounting apparatus, which leads to an increase of a current consumed at each of the drive devices. In general, while an operational speed of each drive device is unavoidably raised so as to increase a production capacity per unit time, this requires to be made a construction including a drive device light in weight, associated with an increase in a capacity of an electric motor or the like used in the drive device. Power consumption increases in accordance with an increase in capacity of an electric motor, or the like, and thus, improving production capacity and saving energy contradict each other.

SUMMARY OF THE INVENTION

The present invention is devised to solve the above problem, and an object of the present invention is to provide an electronic component mounting apparatus and a method executed by the electronic component mounting apparatus for controlling power supply whereby a consumption power amount can be reduced as compared with the background art.

In accomplishing these and other aspects, according to a first aspect of the present invention, there is provided an electronic component mounting apparatus, which comprises:

a component feed device for supplying electronic components, to be mounted on a mount object, which has a drive power source device for the feed device for supplying a driving electric power for the component feed device, and a control power source device for the feed device for supplying an operational control electric power for the component feed device;

a component transfer device for holding electronic components received from the component feed device and mounting them onto the mount object, which has a drive power source device for the transfer device for supplying a driving electric power for the component transfer device, and a control power source device for the transfer device for supplying an operational control electric power for the component transfer device; and a control device for controlling operations of the component feed device and component transfer device, wherein based on a detection of the control device that the electronic component mounting apparatus is at a halt in operation because of a reason other than a shutoff of power supply to the electronic component mounting apparatus, in at least one of the drive power source devices for the feed device and the transfer device of the component feed device, the control device shuts off power supply to the drive power source device thereof while maintaining power supply to the control power source device thereof.

In the first aspect, a halt condition detected by the control device may result from maintenance work performed for the electronic component mounting apparatus, a component shortage at the component feed device, a wait mode for a mount object to be carried into the electronic component mounting apparatus, or an operation failure in at least one of the component feed device and the component transfer device.

In the first aspect, in the wait mode for the mount object, based on a cancel of the wait mode, the control device may resume operations of the component feed device and component transfer device without a judgment by a worker.

In the first aspect, the control device may detect the halt condition based on output information from encoders equipped at the component feed device and the component transfer device.

According to a second aspect of the present invention, there is provided a power supply control method performed by an electronic component mounting apparatus which mounts electronic components onto a mount object, the power supply control method comprising:

detecting an operation halt condition resulting from a reason other than a shutoff of power supply to the electronic component mounting apparatus; and after this detection, shutting off a supply of driving electric power to a part in the operation halt condition constituting the electronic component mounting apparatus, while a supply of operational control electric power is maintained to the part of the electronic component mounting apparatus.

In the electronic component mounting apparatus according to the first aspect of the present invention and in the method for controlling the power supply according to the second aspect of the present invention, the control device is arranged in the electronic component mounting apparatus and detects a drive device which stops operating because of some reason other than the shutoff of the power supply, to the electronic component mounting apparatus. Then, the control device shuts off the power supply for driving the drive device while maintaining the power supply, for controlling operation of the drive device, to the stopped drive device of the electronic component mounting apparatus. Since the drive power source is shut off to the stopped drive device, wasteful power consumption is eliminated and production is continued with a necessary minimum amount of power.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
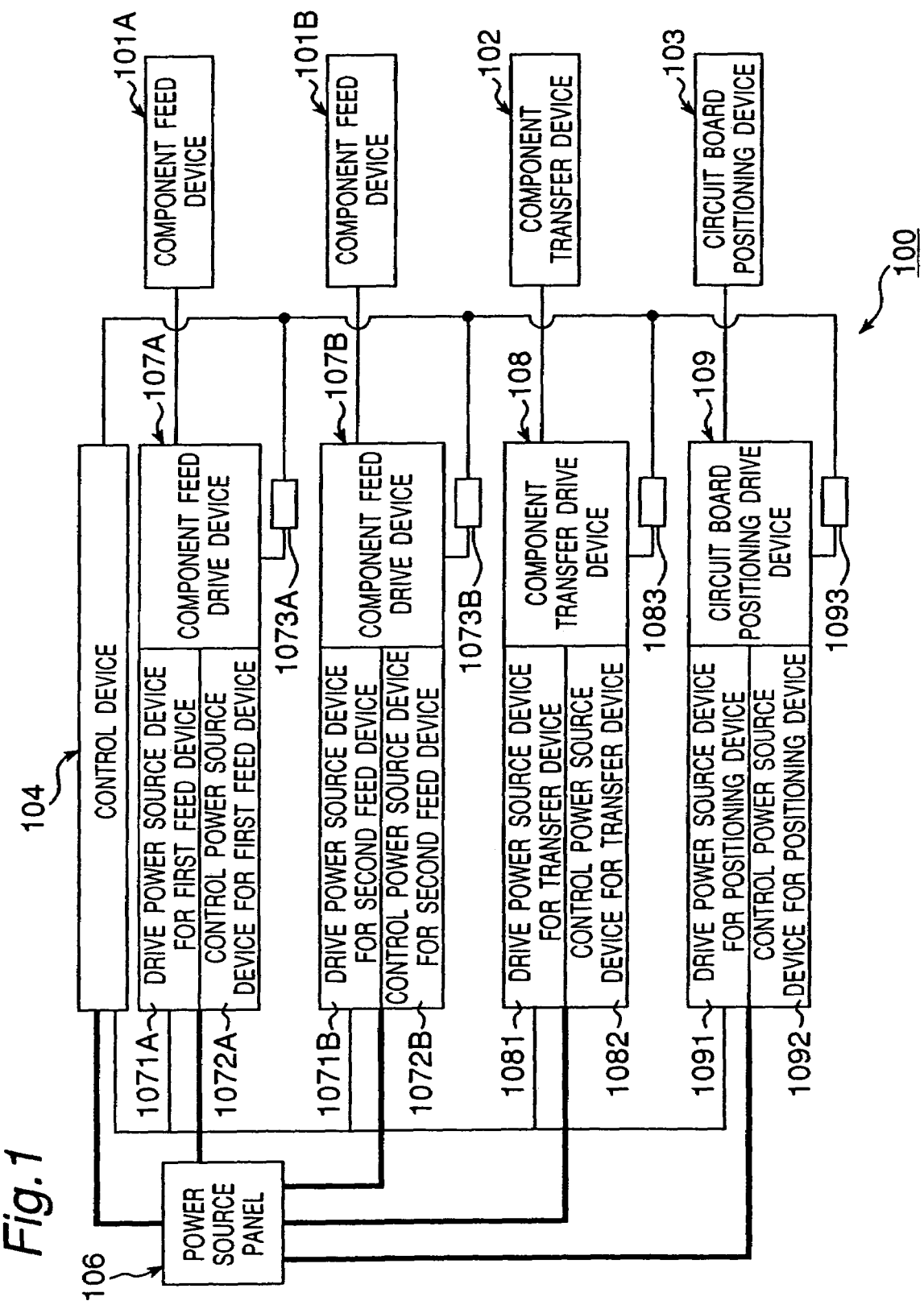
FIG. 1 is a schematic diagram showing a control system in which a control device, set to an electronic component mounting apparatus according to an embodiment of the present invention, connects and shuts off a power source to each drive device.

An electronic component mounting apparatus, which is an embodiment of the present invention, and a power supply control method executed by the electronic component mounting apparatus will be described below with reference to drawings. Same parts are designated by same reference numerals throughout the drawings.

An example functioning as an "object to be mounted" described in the foregoing "Summary Of The Invention" corresponds to a circuit board in the embodiment. However, the object to be mounted is not restricted to this and covers conceptually circuit boards or the like having, for example, a liquid crystal display part.

FIG. 1 shows an electronic component mounting apparatus 100 according to the embodiment. The electronic component mounting apparatus 100 roughly comprises: component feed devices 101A, 101B movable in an X direction for supplying electronic components 111 to be mounted to a circuit board 105; a rotary type component transfer device 102 for holding the electronic components 111 received from the component feed device 101A or component feed device 101B, and mounting these held electronic components 111 onto the circuit board 105; a circuit board positioning device 103 for moving the circuit board 105 in X, Y directions orthogonal to each other so that a mount position on the circuit board 105 is positioned at a component hold release position of the component transfer device 102; and a control device 104 for controlling the component feed devices 101A, 101B, the component transfer device 102, and the circuit board positioning device 103 in association with each other.

The component feed devices 101A, 101B are driven by component feed drive devices 107A, 107B, the component transfer device 102 is driven by a component transfer drive device 108, and the circuit board positioning device 103 is driven by a circuit board positioning drive device 109.

Since the electronic component mounting apparatus 100 has two component feed devices 101A, 101B as above, a component mount operation is continued with use of electronic components 111 present in one of the component feed devices even if the other component feed device becomes short of the components.

The component transfer device 102 removes predetermined electronic components 111 from the component feed device 101A or component feed device 101B in response to a command of the control device 104 and transfers the electronic components 111 to the circuit board placed at the circuit board positioning device 103. During a time after the electronic components 111 are removed and before the electronic components are transferred onto the circuit board, hold states or hold postures of the electronic components 111 as held by the component transfer device 102 are detected with utilization of a sensor or an image recognition device. The component transfer device corrects the hold postures of the electronic components 111 on the basis of this detected information, so that the electronic components are correctly mounted on the electronic circuit board.

Figure 5:
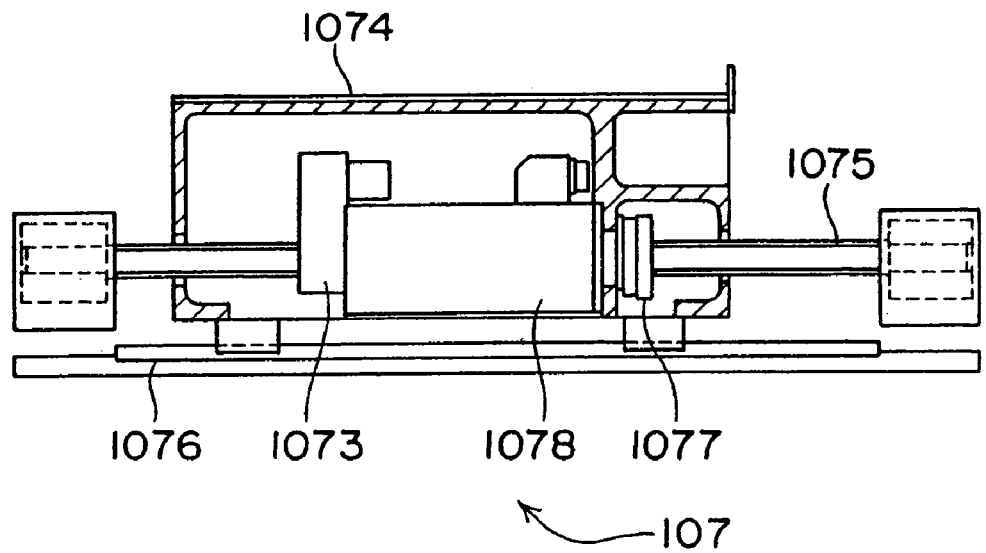
FIG. 5 is a diagram showing structure of a component feed drive device shown in FIG. 1.

Each of the component feed drive devices 107A, 107B is constructed in a constitution as shown in FIG. 5. The component feed drive device 107A will be discussed by way of example, but the same description is applied to the component feed drive device 107B. The component feed drive device 107A includes a table 1074 where the component feed device 101A is loaded, a ball screw 1075 extending in the X direction, and a linear guide 1076 extending in the X direction for guiding a movement of the table. The table 1074 has a nut 1077 which is engaged with the ball screw 1075 and to which a hollow motor 1078 and an encoder 1073 are set into one body. The table is moved in the X direction by the hollow motor 1078 as a driving part. The encoder 1073 which sends a signal indicating a movement amount of the table as an example of a detection device for detecting an operational state of the feed device is connected to the control device 104.

Figure 2:
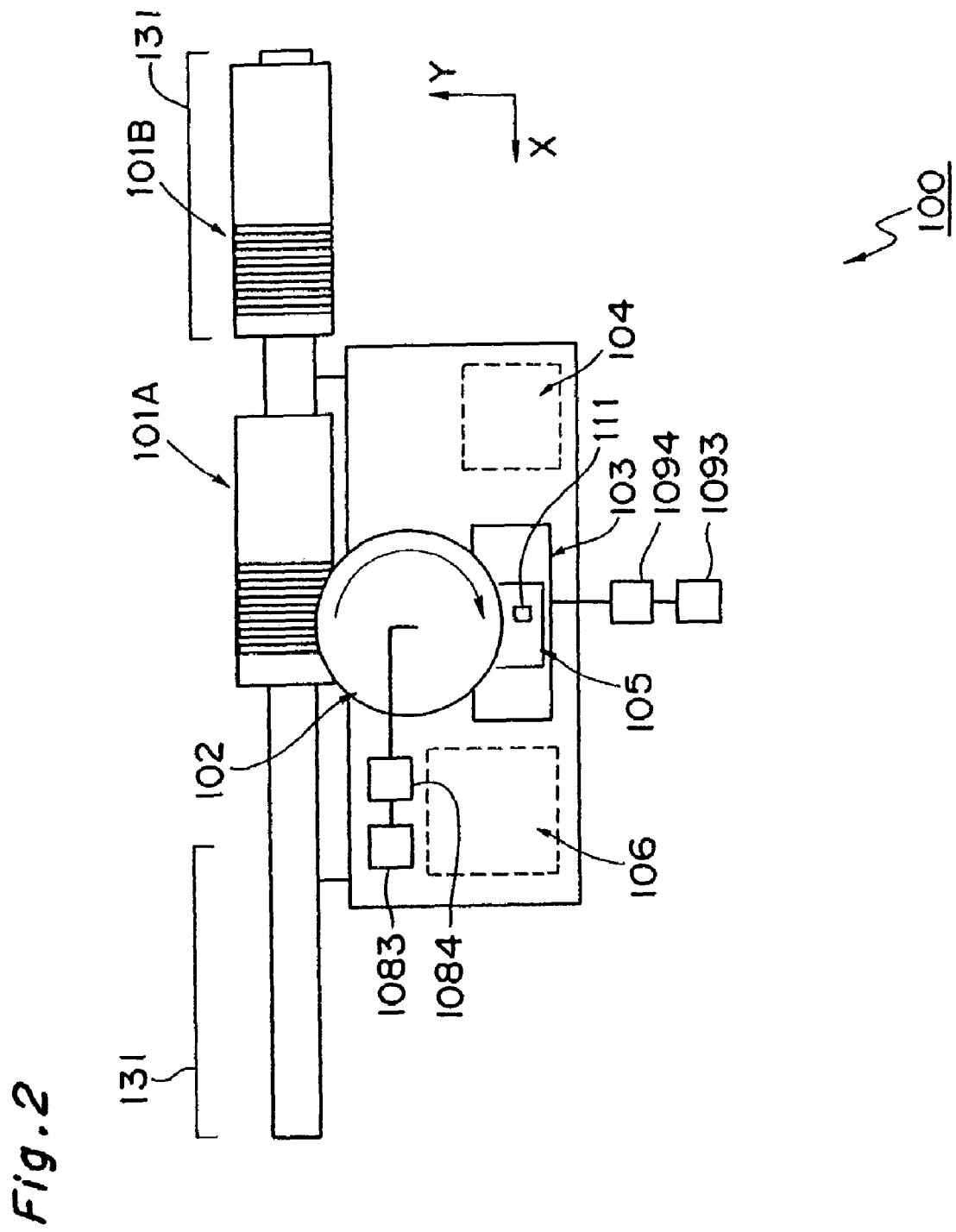
FIG. 2 is a diagram schematically showing a constitution of the electronic component mounting apparatus of the embodiment including the control system of FIG. 1.

The component transfer drive device 108 is a structure, including a motor 1084 as a driving part for rotating the component transfer device 102 in a clockwise direction shown by an arrow in FIG. 2 and, an encoder 1083 as an example of a detection device for detecting an operational state of the transfer device and which detects and sends a revolution number of an output shaft of the motor 1084. The encoder 1083 is connected to the control device 104.

Figure 6:
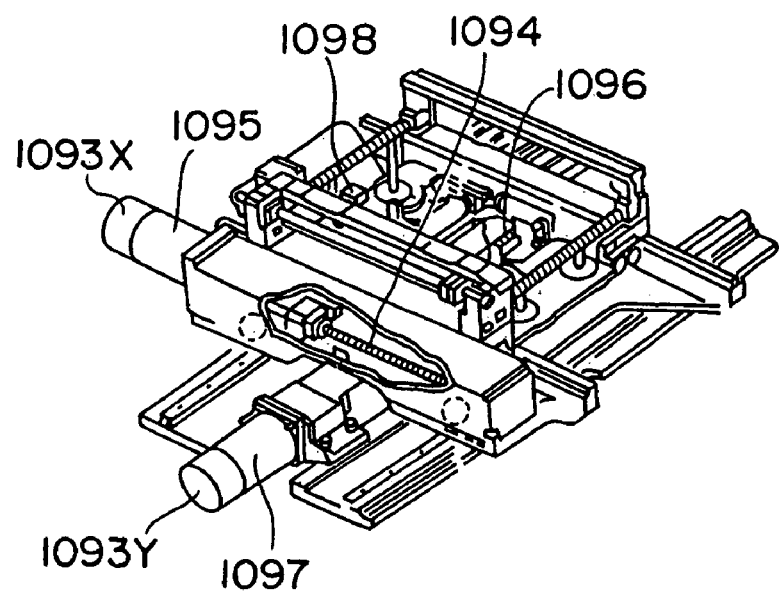
FIG. 6 is a perspective view showing structure of a circuit board positioning drive device of FIG. 1.
Figure 7:
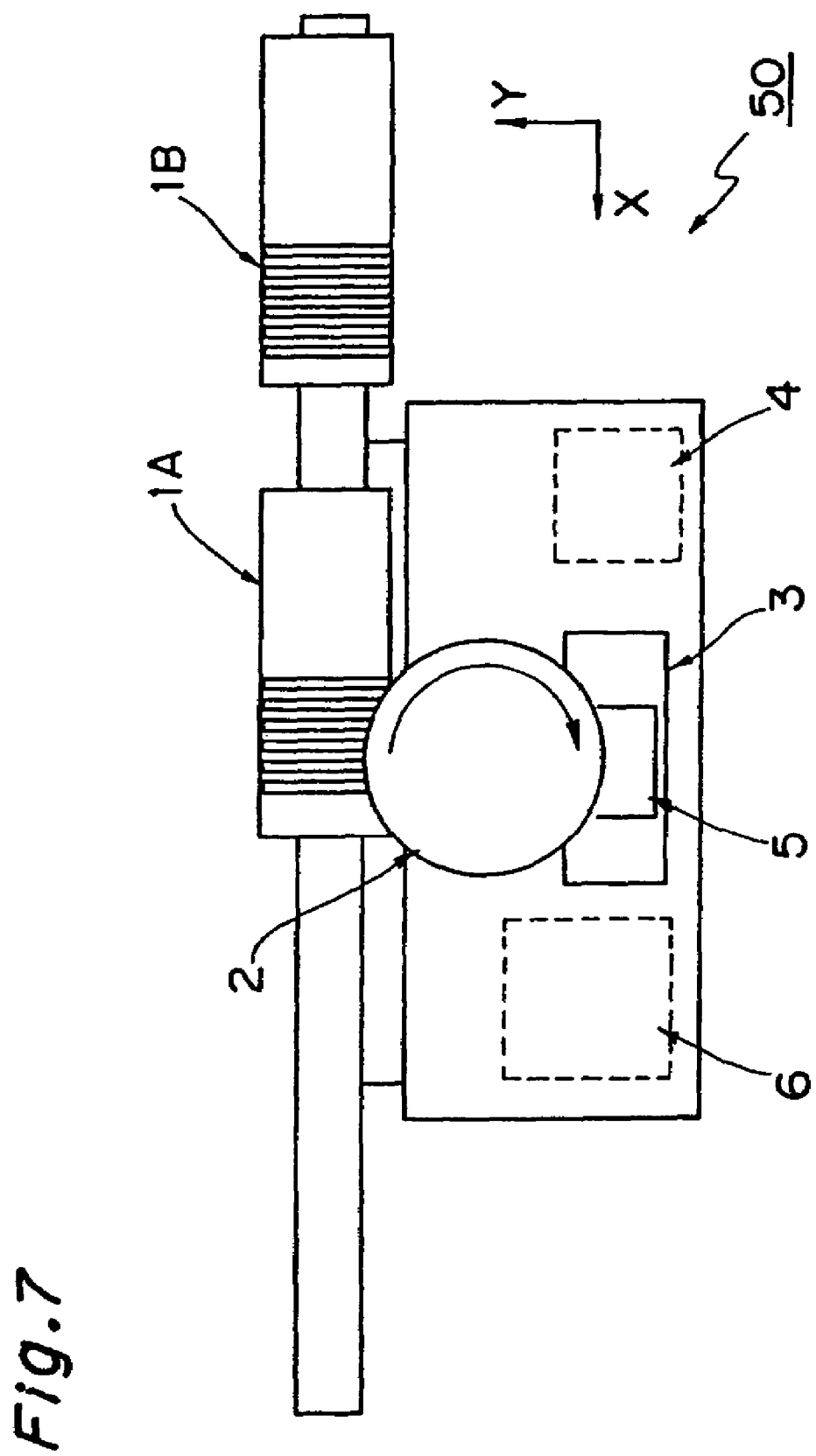
FIG. 7 is a schematic diagram of constitution of a conventional electronic component mounting apparatus.
Figure 8:
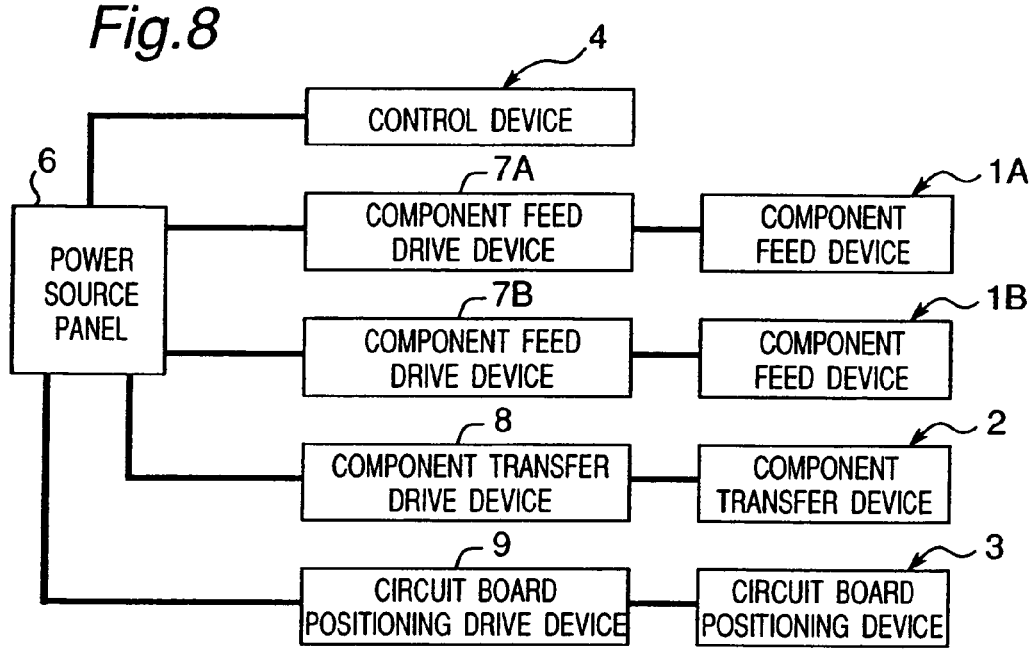
FIG. 8 is a schematic diagram of a control system in the conventional electronic component mounting apparatus of FIG. 7.
Figure 9:
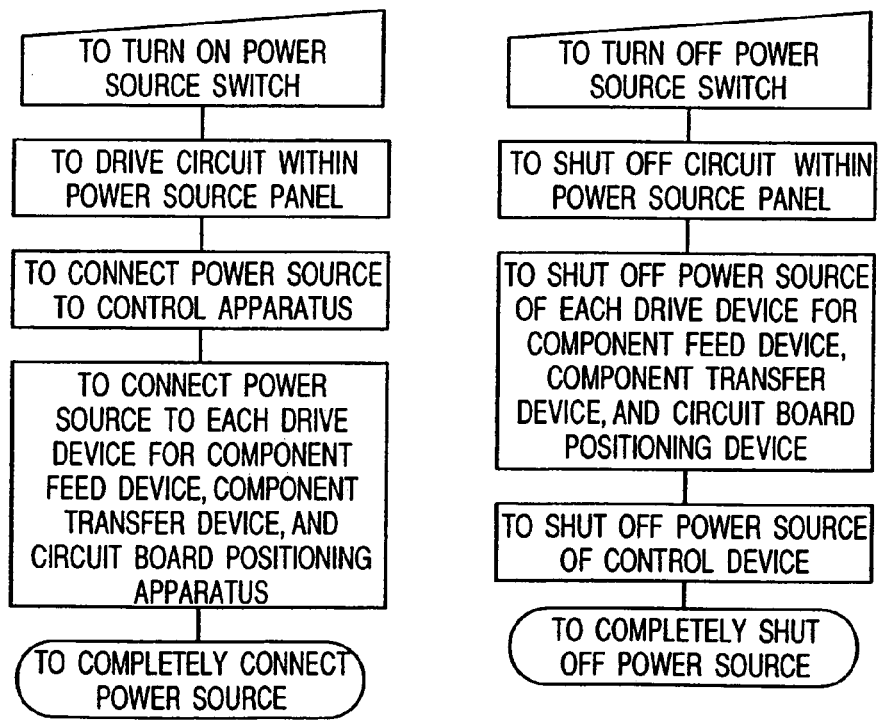
FIG. 9 is flow charts explaining operation at connection and shutoff times of a power source in the conventional electronic component mounting apparatus of FIG.

As indicated in FIG. 6, the circuit board positioning drive device 109 has: a ball screw 1094 extending in the X direction; a motor 1095 as a driving part for rotating the ball screw 1094 in a direction about an axis of the ball screw 1094; an encoder 1093X as an example of a circuit board positioning device operational state detection device for detecting a revolution number of an output shaft of the motor 1095 and sending the revolution number as a movement amount in the X direction; a ball screw 1096 extending in the Y direction; a motor 1097 as a driving part for rotating the ball screw 1096 in a direction about an axis of the ball screw 1096; and an encoder 1093Y as another example of the circuit board positioning device operational state detection device for detecting a revolution number of an output shaft of the motor 1097 and sending this revolution number as a movement amount in the Y direction. The encoders 1093X, 1093Y are connected to the control device 104.

Each of the component feed drive devices 107A, 107B, the component transfer drive device 108, and the circuit board positioning drive device 109 has a drive power source device for supplying electric power for driving to each of these drive devices, and a control power source device for supplying electric power for controlling to each of the drive devices. More specifically, the component feed drive device 107A has a drive power source device 1071A for the first feed device 101A for feeding electric power to the hollow motor 1078, and a control power source device 1072A for the first feed device. The component feed drive device 107B has a drive power source device 1071B for the second feed device 101B for feeding electric power to the hollow motor 1078, and a control power source device 1072B for the second feed device. The component transfer drive device 108 has a drive power source device 1081 for the transfer device 102 for feeding electric power to the motor 1084, and a control power source device 1082 for the transfer device. The circuit board positioning drive device 109 has a drive power source device 1091 for the positioning device 103 for feeding electric power to the motors 1095, 1097, and a control power source device 1092 for the positioning device.

A reason why the drive power source devices 1071A, 1071B, 1081, 1091, and the control power source devices 1072A, 1072B, 1082, 1092 are set separately is to prevent positioning information on each drive device 107A, 107B, 108, 109 from being lost when power supply only to the drive power source devices 1071A, 1071B, 1081, 1091 is shut off while power supply to the control power source devices 1072A, 1072B, 1082, 1092 is maintained, and also to let a control part operate to prevent a displacement or drop of a component at the feed devices, the transfer device, and/or the positioning device because of its or their own load(s), or the like, subsequent to shutoff of the drive power source.

FIG. 1 depicts a connection for control from the control device 104 to the drive devices 107A, 107B, 108, 109, component feed devices 101A, 101B, component transfer device 102, and circuit board positioning device 103 via the power source devices, while other connections are not illustrated to avoid complexity.

Electric power is supplied from a power source panel 106 to each of the drive power source device 1071A for the first feed device, the control power source device 1072A for the first feed device, the drive power source device 1071B for the second feed device, the control power source device 1072B for the second feed device, the drive power source device 1081 for the transfer device, the control power source device 1082 for the transfer device, the drive power source device 1091 for the positioning device and the control power source device 1092 for the positioning device, and the control device 104.

Each of the drive power source device 1071A, the drive power source device 1071B, the drive power source device 1081, and the drive power source device 1091 has a connection-shutoff function to connect, disconnect this power source. The control device 104 controls power supply to each of the drive power source device 1071A, the drive power source device 1071B, the drive power source device 1081, and the drive power source device 1091 on the basis of information output from a corresponding encoder 1073A, 1073B, 1083, and 1093. This control operation will be detailed later.

In the meantime, electric power is continually supplied from the power source panel 106 to each of the control power source device 1072A, the control power source device 1072B, the control power source device 1082, and the control power source device 1092 except when power supply to the electronic component mounting apparatus 100 is shut off.

A method for controlling power supply to each drive device 107A, 107B, 108, and 109, which is performed by the control device 104 among other operations in the above-constituted electronic component mounting apparatus 100 will be discussed hereinbelow.

Figure 3:
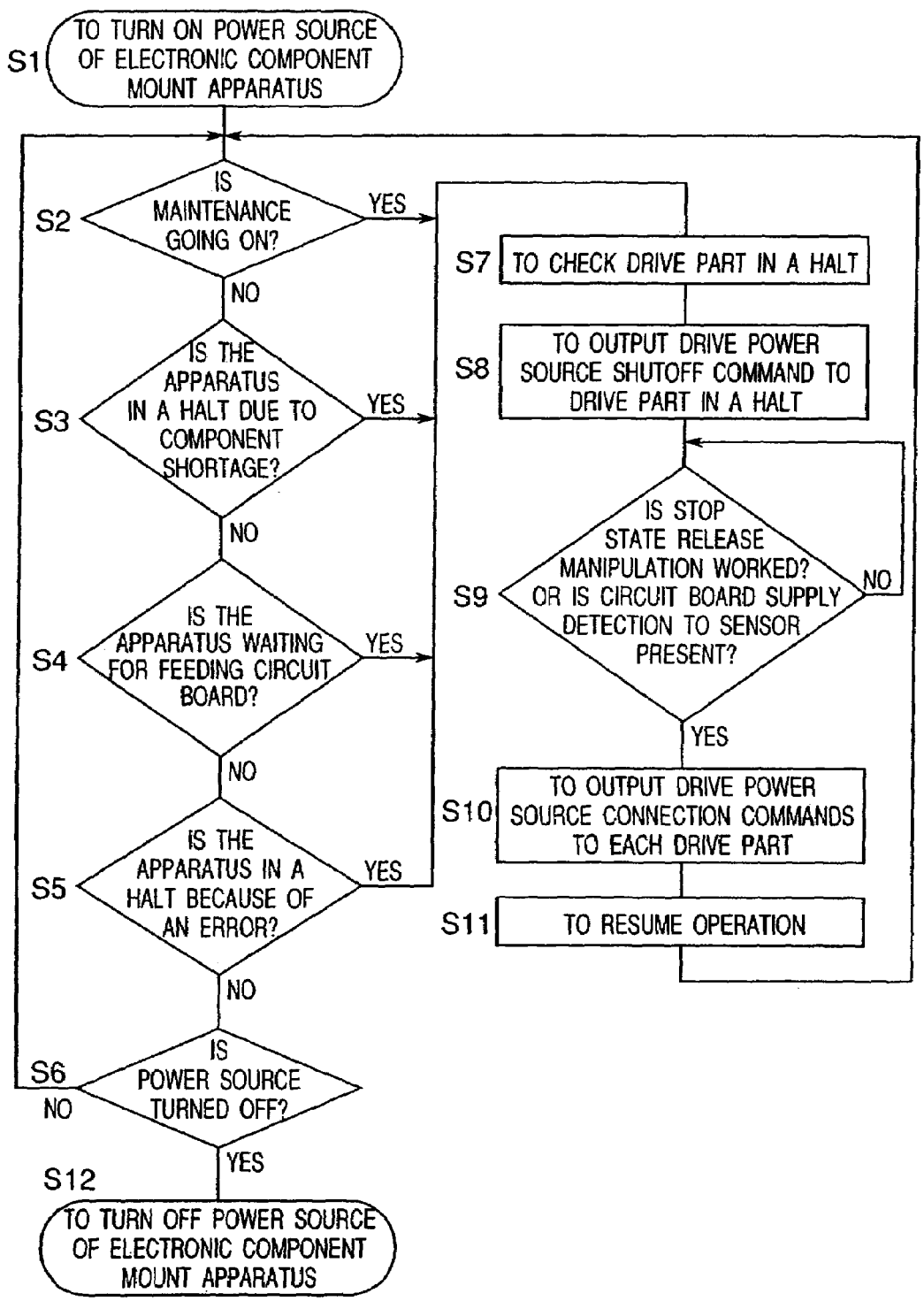
FIG. 3 is a flow chart explaining operation in a power supply control method executed by the electronic component mounting apparatus of FIG. 2.

In step (designated by "S" in FIG. 3) 1 in FIG. 3, a power source of the electronic component mounting apparatus 100 is turned on. In this state, the control device 104 outputs commands to each of the drive devices 107A, 107B, 108, and 109 to connect a corresponding drive power source device 1071A, 1071B, 1081, and 1091. The control device 104 repeatedly makes judgements in steps 2 through 6 based on signals from the encoders 1073A, 1073B, 1083, and 1093. Operations in these steps will be described herein. A judgment order in the steps 2–6 is not limited to the embodiment and not particularly specified.

In step 2, the control device 104 judges whether the electronic component mounting apparatus 100 is in a maintenance mode, such as a check mode or a machine model switch mode or the like. In other words, in the maintenance mode with power being supplied to the electronic component mounting apparatus 100, when maintenance work is performed, all of the component feed devices 101A, 101B, the component transfer device 102, and the circuit board positioning device 103 are at rest. Thus, a stop state signal is sent to the control device 104 from the encoders 1073A, 1073B, 1083, 1093 of these apparatuses. Based on signals from the encoders 1073A, 1073B, 1083, 1093, in step 7, the control device 104 judges which of the drive devices is stopped. In step 8, the control device 104 outputs a power source shutoff command(s) to a corresponding drive power source device(s) for the drive device(s) judged to be in a halt condition. That is, since the component feed devices 101A, 101B, the component transfer device 102, and the positioning device 103 are all at rest in the maintenance mode, the control device 104 shuts off power supply to the corresponding drive power source devices 1071A, 1071B, 1081, and 1091.

Upon completion of the maintenance work, following a stop state release operation by a worker in step 9, the control device 104 outputs in step 10 drive power source connection commands to the drive power source devices 1071A, 1071B, 1081, and 1091 to which the power source shutoff command has been output. The electronic component mounting apparatus 100 is accordingly turned operable in step 11.

In step 3, in the wake of a component shortage at the component feed devices 101A, 101B, the component feed device that is short of components moves to stop at a component replenishment position so that electronic components 111 are supplied. In accordance with signals sent from the encoders 1073A, 1073B as described earlier, the control device 104 detects in step 7 which of the two component feed devices 101A, 101B is stopped. The component feed device 101A is supposed here to be short of components and at rest. In step 8, the control device 104 outputs a drive power source shutoff command to the drive power source device 1071A which is set to the component drive device 107A of the component feed device 101A at rest. The drive power source device 1071A shuts off the drive power source in response to a drive power source shutoff command. The other drive devices 107B, 108, 109 naturally keep operating at this time.

When replenishment of electronic components 111 is completed at the component feed device 101A, in step 9, a replenishment completion signal is supplied through a worker's manipulation to the control device 104. The control device 104 memorizes, according to the replenishment completion signal, that the component feed device 101A is turned in a state to be operable. Simultaneously with storage, the control device 104 judges that a stop state of the component feed device 101A is freed, with outputting in step 10 of a drive power source connection command to the drive power source device 1071A for the first feed device. In consequence, the component feed device 101A is returned to a production operation in step 11.

Upon occurrence of a wait condition in feeding of circuit boards, since each drive device 107A, 107B, 108, and 109 is in a halt condition, the control device 104 checks the stopped drive devices in step 7 and outputs drive power source shutoff commands to each drive power source device 1071A, 1071B, 1081, 1091 in step 8. Although the electronic component mounting apparatus 100 is brought to a halt by the worker for the foregoing maintenance work, the electronic component mounting apparatus 100 is stopped on the basis of a judgment by the control device 104 in an above circuit board wait condition. Therefore, the electronic component mounting apparatus is restarted on the basis of the judgment by the control device 104, not a judgment by the worker.

In step 9, when the circuit board wait condition is relieved as a result of supply of circuit boards or the like, the control device 104 detects from a circuit board feed detection sensor 1098, equipped in the circuit board positioning drive device 109, that the circuit board wait condition is relieved. The control device outputs in step 10 drive power source connection commands to each drive power source device 1071A, 1071B, 1081, and 1091 to which the drive power source shutoff commands have been output, whereby production is started again in step 11.

If any operation abnormality takes place in the electronic component mounting apparatus 100 as in step 5, each drive device 107A, 107B, 108, and 109 is brought to a stop. Thus, the control device 104 checks the stopped drive devices in step 7 and sends drive power source shutoff commands to each drive power source device 1071A, 1071B, 1081, and 1091 in step 8. Accordingly, operation stop because of some operation abnormality is also performed on the basis of the judgment by the control device 104. However, operation is resumed by the worker's judgment, which is a difference from the above-discussed circuit board wait condition.

In step 9, in response to the worker's manipulation to relieve an operation abnormality state, the control device 104 outputs drive power source connection commands to each of the drive power source devices 1071A, 1071B, 1081, and 1091 to which drive power source shutoff commands have been output. Production is resumed in step 11.

When the control device 104 detects shutoff of power supply to the electronic component mounting apparatus 100 in step 6, the control device 104 generates power source shutoff commands to each drive power source device 1071A, 1071B, 1081, and 1091. In addition to the shutoff commands by the control device 104, the power source panel 106 works at the same time to shut off the power source, thus realizing an emergency stop function.

In the electronic component mounting apparatus 100 according to the embodiment as above, the control device 104 recognizes a drive device in a halt condition on the basis of an output signal from at least one of the encoders 1073A, 1073B, 1083, and 1093 in various types of stop states brought about during operation of the electronic component mounting apparatus 100. As a consequence, the control device 104 causes the drive power source device of the drive device in a halt condition to supply electric power to the drive part corresponding to the drive device in the halt condition. Therefore, power not used for production is prevented from being consumed wastefully. A consumption amount of power by the electronic component mounting apparatus 100 is reduced accordingly and production is continued with a necessary minimum power.

Figure 4:
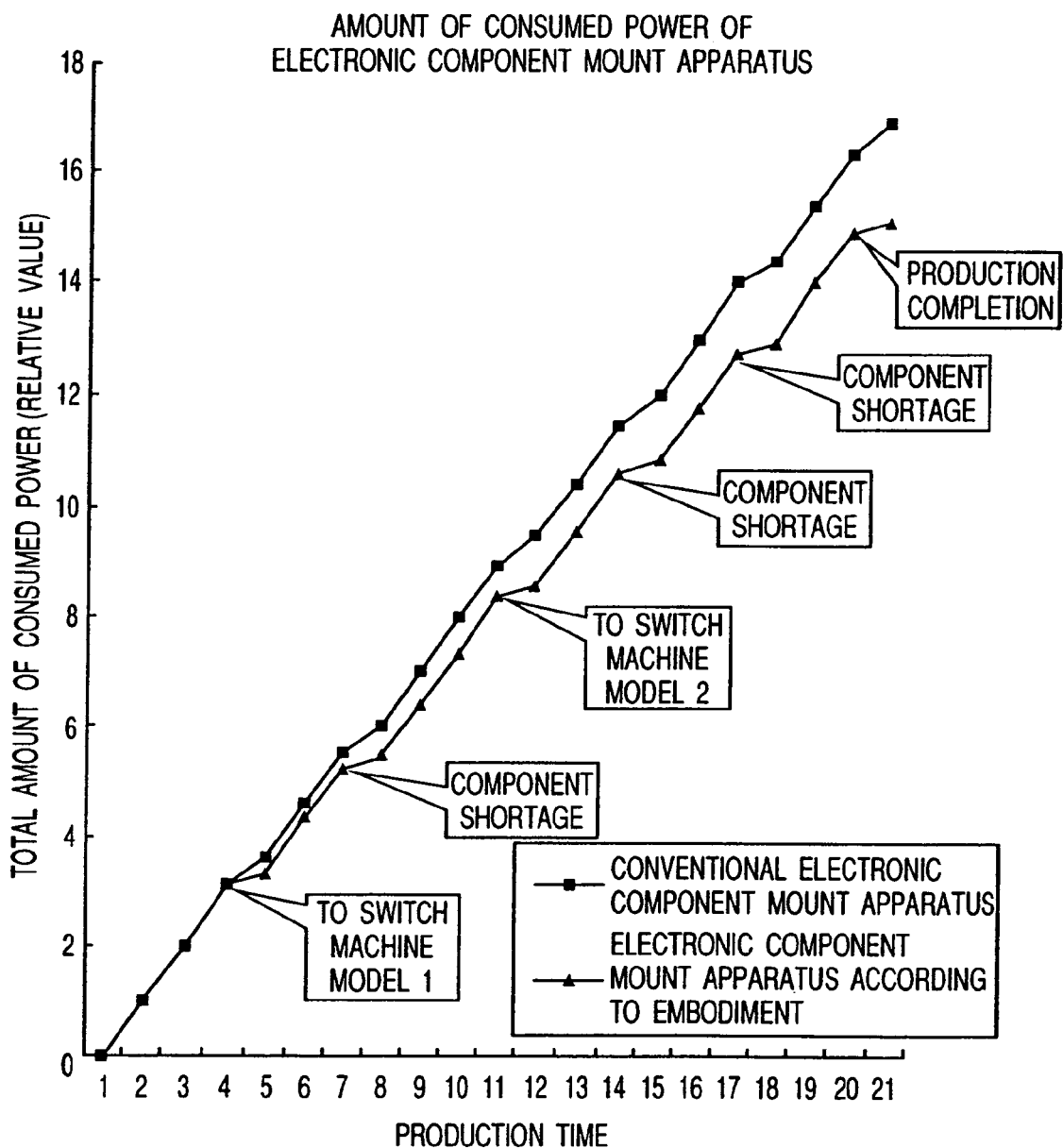
FIG. 4 is a conceptual graph indicating a change in power consumption amount of the electronic component mounting apparatus of FIG. 2 and a conventional electronic component mounting apparatus.

More specifically, each of changes of total amounts of consumed power in each of the electronic component mounting apparatus 100 and a conventional electronic component mounting apparatus is shown in a graph in FIG. 4. As is clear from the graph, although a consumption amount at a normal operation is equal between these apparatuses, the electronic component mounting apparatus 100 consumes less power as compared with the conventional electronic component mounting apparatus, for example, in the event that a stop state such as component shortage or the like has occurred. Accordingly, the larger the stop state becomes, the more the sum of consumed power is reduced in the electronic component mounting apparatus 100 than in the conventional electronic component mounting apparatus.

Further, since the control device 104 orders power source connection and shutoff, it eliminates particularly complicated procedures for a worker and surely saves energy. Moreover, since the drive power source is shut off to the drive device in a halt condition, the worker's safety in handling the drive device in a halt condition is enhanced in comparison with the background art.

In the present embodiment, connection and disconnection to the drive power source device 1071A, 1071B, 1081, 1091 for the drive device 107A, 107B, 108, 109 is realized at the drive power source device 1071A, 1071B, 1081, 1091. However, this function may be incorporated in the power source panel 106.

When the drive power source device 1071A, 1071B, 1081, 1091 is to be connected to the power source, a wait time is required in some cases before the power source is turned to a stable operation state. For avoiding this inconvenience, the control device 104 may be provided with a constant wait mode at a connection time of the power source or, the power source panel 106 may be equipped with a notification function of informing that the power source is turned in the stable operation state.

Although a so-called rotary type electronic component mounting apparatus 100 is described by way of example in the foregoing embodiment, the present invention is not limited to this type and is applicable to a robot type machine in which a transfer device which corresponds to the component transfer device 102 for holding and transferring the electronic components 111 can move in the X, Y directions.

The entire disclosure of Japanese Patent Application No. 11-113560 filed on Apr. 21, 1999, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A power supply control method comprising:
in an electronic component mounting apparatus including a component feed device for feeding electronic components, a component transfer device for mounting onto an object electronic components fed from said component feed device, and an object positioning device for moving the object and thereby positioning the object,
   (i) detecting halting of operation of at least one of said component feed device, said component transfer device and said object positioning device resulting from a cause other than shutoff of power supply to said electronic component mounting apparatus; and then
   (ii) stopping supply of driving electric power to said at least one of said component feed device, said component transfer device and said object positioning device, while maintaining supply of operational control electric power to said at least one of said component feed device, said component transfer device and said object positioning device.

2. The method according to claim 1, wherein
detecting halting of operation of at least one of said component feed device, said component transfer device and said object positioning device, resulting from a cause other than shutoff of power supply to said electronic component mounting apparatus, comprises detecting halting of operation, of said at least one of said component feed device, said component transfer device and said object positioning device, resulting from waiting for feeding of an object onto which electronic components are to be mounted.

3. The method according to claim 2, wherein
stopping supply of driving electric power to said at least one of said component feed device, said component transfer device and said object positioning device, while maintaining supply of operational control electric power to said at least one of said component feed device, said component transfer device and said object positioning device, comprises stopping supply of driving electric power to each of said component feed device, component transfer device and object positioning device, while maintaining supply of operational control electric power to said each of said component feed device, component transfer device and object positioning device.

4. The method according to claim 3, further comprising:
after feeding of said object onto which electronic components are to be mounted, resuming supply of driving electric power to said each of said component feed device, component transfer device and object positioning device.

5. The method according to claim 4, wherein
resuming supply of driving electric power to said each of said component feed device, component transfer device and object positioning device comprises resuming said supply of driving electric power after a set time has elapsed from when the feeding of said object has occurred such that a power source for supplying said driving electric power is placed in a stable operational state.

6. The method according to claim 1, wherein
detecting halting of operation of at least one of said component feed device, said component transfer device and said object positioning device, resulting from a cause other than shutoff of power supply to said electronic component mounting apparatus, comprises detecting halting of operation, of said at least one of said component feed device, said component transfer device and said object positioning device, resulting from a shortage of electronic components.

7. The method according to claim 6, wherein
stopping supply of driving electric power to said at least one of said component feed device, said component transfer device and said object positioning device, while maintaining supply of operational control electric power to said at least one of said component feed device, said component transfer device and said object positioning device comprises stopping supply of driving electric power to said component feed device while maintaining supply of operational control electric power to said component feed device.

8. The method according to claim 7, further comprising:
after replenishment of electronic components so as to eliminate said shortage of electronic components, resuming supply of driving electric power to said component feed device.

9. The method according to claim 8, wherein
resuming supply of driving electric power to said component feed device comprises resuming said supply of driving electric power after a set time has elapsed from when the replenishment of electronic components has occurred such that a power source for supplying said driving electric power is placed in a stable operational state.

10. The method according to claim 1, wherein
stopping supply of driving electric power to said at least one of said component feed device, said component transfer device and said object positioning device, while maintaining supply of operational control electric power to said at least one of said component feed device, said component transfer device and said object positioning device comprises stopping supply of driving electric power to each of said component feed device, component transfer device and object positioning device, while maintaining supply of operational control electric power to said each of said component feed device, component transfer device and object positioning device.

11. The method according to claim 10, further comprising:

after eliminating the cause resulting in the halting of operation of said at least one of said component feed device, said component transfer device and said object positioning device, resuming supply of driving electric power to said each of said component feed device, component transfer device and object positioning device.

12. The method according to claim 11, wherein resuming supply of driving electric power to said each of said component feed device, component transfer device and object positioning device comprises resuming said supply of driving electric power after a set time has elapsed from when the cause resulting in the halting of the operation has been eliminated such that a power source for supplying said driving electric power is placed in a stable operational state.

* * * * *